United States Patent
Shiraishi (10) Patent No.: US 7,203,275 B2
(45) Date of Patent: Apr. 10, 2007

(54) MULTILAYER FILM REFLECTOR AND X-RAY EXPOSURE SYSTEM

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/272,610

(22) Filed: Nov. 14, 2005

(65) Prior Publication Data

US 2006/0062348 A1 Mar. 23, 2006

Related U.S. Application Data

(63) Continuation of application No. PCT/JP2004/007410, filed on May 24, 2004.

(30) Foreign Application Priority Data

Jun. 2, 2003 (JP) .............................. 2003-156212
Feb. 23, 2004 (JP) .............................. 2004-045771

(51) Int. Cl.
*G21K 1/06* (2006.01)
(52) U.S. Cl. .......................................... 378/84; 378/34
(58) Field of Classification Search ................. 378/34, 378/84
See application file for complete search history.

(56) References Cited

U.S. PATENT DOCUMENTS 6,011,646 A   1/2000   Mirkarimi et al.
6,134,049 A  10/2000   Spiller et al.

2002/0171817 A1  11/2002  Banonneau et al.
2002/0171922 A1  11/2002  Shiraishi et al.
2003/0031938 A1*  2/2003  Singh et al. .................. 430/5

FOREIGN PATENT DOCUMENTS

JP          5-346496 A    12/1993
JP       2002-329649 A    11/2002

OTHER PUBLICATIONS

D. A. Tichenor et al, "Recent results in the development of an intergrated EUVL laboratory tool", *SPIE*, vol. 2437, pp. 292-307 (1995).

(Continued)

*Primary Examiner*—Edward J. Glick
*Assistant Examiner*—Hoon Song
(74) *Attorney, Agent, or Firm*—Frishauf, Holtz, Goodman & Chick, P.C.

(57) ABSTRACT

The present invention makes it possible to obtain a multilayer film reflective mirror 61 comprising a first multilayer film 67 which is formed by alternately laminating Mo layers 671 and Si layers 673 on a substrate 63, and a second multilayer film 65 which is formed on top of the first multilayer film 67, and which is formed by alternately laminating Mo layers 651 and Si layers 653, wherein the thickness of the Mo layers in the first multilayer film is substantially equal to or smaller than the thickness of the Mo layers in the second multilayer film, and the ratio of the thickness of the Mo layers to the thickness of the Si layers in the first multilayer film is different from the ratio of these thicknesses in the second multilayer film. As a result, a multilayer film reflective mirror with a low internal stress in which a drop in the reflectivity is suppressed can be obtained.

16 Claims, 4 Drawing Sheets

OTHER PUBLICATIONS

C. Montcalm, "Multilayer reflective coatings for extreme-ultraviolet lithography" *SPIE*, vol. 3331, pp. 42-51 (19998).

E. Zoethout et al, "Street Mitigation in Mo/Si Multilayers for EUV Lithography", *Proceedings of SPIE*, vol. 5037, pp. 872-878 (2003).

M. Shiraishi et al, "Mo/Si multilayers deposited by low-pressure rotary magnet cathode sputtering for extreme ultraviolet lithography", *Proceedings of SPIE*, vol. 5037, pp. 249-256 (2003).

* cited by examiner

MULTILAYER FILM REFLECTOR AND X-RAY EXPOSURE SYSTEM

This application is a continuation application of International Application No. PCT/JP2004/007410 filed May 24, 2004, which is hereby incorporated by reference.

This is a continuation from PCT International Application No. PCT/JP2004/007410 filed on May 24, 2004, which is hereby incorporated by reference

TECHNICAL FIELD

The present invention relates to a multilayer film reflective mirror that is used in the X-ray optical system of an X-ray microscope, X-ray analysis device, X-ray exposure apparatus, or the like, and an X-ray exposure apparatus using this multilayer film reflective mirror.

BACKGROUND ART

In recent years, as semiconductor integrated circuits have become finer, projection lithographic techniques using X-rays (which have a shorter wavelength (11 to 14 nm) than conventional ultraviolet light) instead of ultraviolet light have been developed in order to improve the resolving power of optical systems (which is limited by the diffraction limit of light) (for example, see D. Tichenor, et al., "SPIE," 1995, Vol. 2437, p. 292). Such techniques have recently acquired the name of EUV (extreme ultraviolet) lithography, and have shown promise as techniques for obtaining a resolving power of 70 nm or finer, which cannot be realized with conventional photolithography using light rays with a wavelength of 190 nm.

The complex refractive index n of a substance in the X-ray wavelength region is expressed by $n=1-\delta-ik$ ($\delta$ and $k$ are real numbers, and $i$ is a symbol indicating complexity). The imaginary part $k$ of this refractive index expresses X-ray absorption. Since $\delta$ and $k$ are extremely small compared to 1, the refractive index in this region is extremely close to 1. Accordingly, conventional transmissive refraction type optical elements such as lenses cannot be used, and optical systems utilizing reflection are used instead. In the case of oblique-incidence optical systems that utilize total reflection to reflect X-rays that are incident on the reflective surface from an inclined direction, the reflectivity is extremely small at angles of incidence that are smaller than the critical angle $\theta_c$ of total reflection (approximately 20° or smaller at a wavelength of 10 nm) (i.e., angle of incidence that are close to perpendicular). Here, furthermore, the angle of incidence refers to the angle formed by the normal of the plane of incidence and the optical axis of the incident light.

Accordingly, multilayer film reflective mirrors are used in which numerous reflective surfaces (several tens to several hundreds of layers in one example) are formed by laminating a substance having an interfacial amplitude reflectivity that is as high as possible, and the thicknesses of the respective layers are adjusted on the basis of light interference theory so that the phases of the respective reflected waves match. These multilayer film reflective mirrors are formed by alternately laminating, on the surface of a substrate, substances in which the difference between the refractive index in the X-ray wavelength region used and the refractive index in a vacuum (=1) is large,. and substances in which this difference is small.

Furthermore, since these multilayer film reflective mirrors can also reflect X-rays that are perpendicularly incident, an optical system can be constructed which has a smaller aberration than an oblique-incidence optical system using total reflection.

Moreover, such multilayer film reflective mirrors have a wavelength dependence which is such that X-rays are strongly reflected in cases where Bragg equation $$2d\sin\theta = n\lambda$$

(d: periodic length of multilayer film, $\theta$: angle of incidence, $\lambda$: wavelength of X-rays) is satisfied. Therefore, various factors must be selected so that this equation is satisfied.

Known examples of multilayer films used in multilayer film reflective mirrors include films using a combination of W/C multilayer films in which tungsten (W) and carbon (C) are alternately laminated, Mo/C multilayer films in which molybdenum (Mo) and carbon are alternately laminated, and the like. Furthermore, these multilayer films are formed by thin film forming techniques such as sputtering, vacuum evaporation and CVD (chemical vapor deposition).

Moreover, if an Mo/Si multilayer film in which molybdenum (Mo) layers and silicon (Si) layers are alternately laminated is used in the wavelength region in the vicinity of 13.4 nm, a reflectivity of 67.5% can be obtained in the case of perpendicular incidence (angle of incidence: 0°), and if an Mo/Be multilayer film in which Mo layers and beryllium (Be) layers are alternately laminated is used in the wavelength region in the vicinity of 11.3 nm, a reflectivity of 70.2% can be obtained in the case of perpendicular incidence (for example, see C. Montcalm, "Proceedings of SPIE," 1998, Vol. 3331, p. 42). Reflective mirrors using such multilayer films are also applied to reduction projection lithographic technology using soft X-rays that is referred to as EUVL (extreme ultraviolet lithography).

Figure 3:
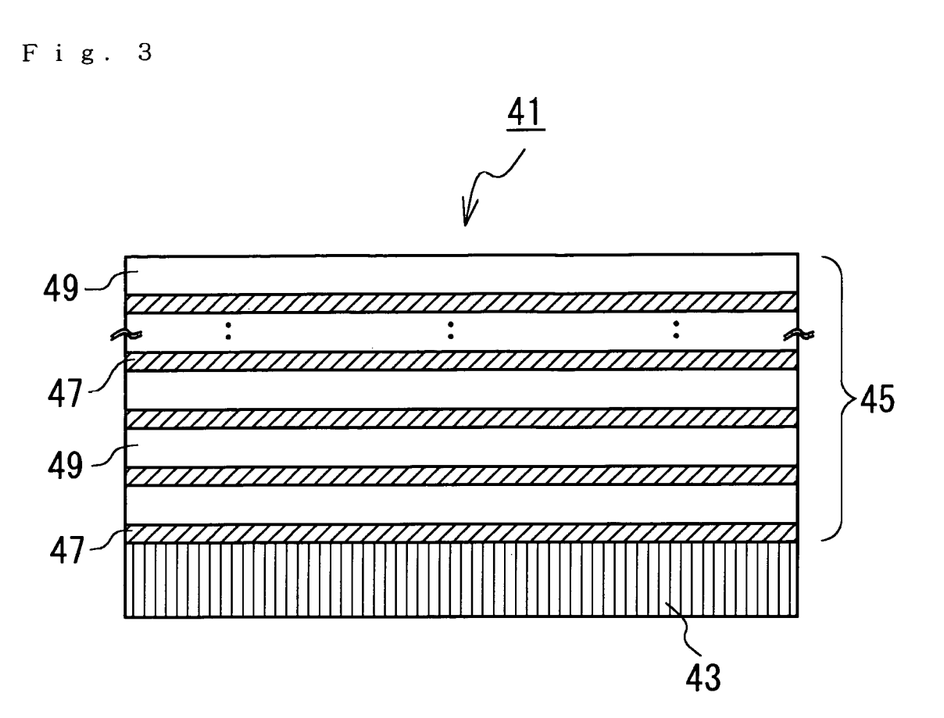
FIG. 3 is a sectional view showing the structure of a multilayer film reflective mirror used in conventional EUVL in model form.

FIG. 3 is a sectional view showing in model form the structure of a multilayer film reflective mirror used in conventional EUVL. This multilayer film reflective mirror 41 is a mirror in which an Mo/Si multilayer film 45 is formed on a substrate 43. In this Mo/Si multilayer film 45, an Mo layer 47 and an Si layer 49 are taken as one layer pair, and approximately 40 to 50 such layer pairs are laminated. The periodic length of this Mo/Si multilayer film 45 (i.e., the thickness of one layer pair) is approximately 7 nm, and the ratio (Γ) of the thickness of one Mo layer to the periodic length is approximately 0.35 to 0.4. Furthermore, the surface (upper surface in the figure) of the substrate 43 ordinarily has a concave shape; however, in order to simplify the description, a portion of the multilayer film reflective mirror is made horizontal in the figure, and the number of laminated layers is abbreviated.

Incidentally, the multilayer film reflective mirror 41 is manufactured by sputtering (ion beam sputtering, magnetron sputtering, or the like), electron beam deposition, or the like; here, the high-reflectivity Mo/Si multilayer film 45 generally has a compressive internal stress of approximately −350 MPa to −450 MPa. As a result, the following problem arises: namely, the substrate 43 of the multilayer film reflective mirror 41 is caused to undergo deformation by the compressive internal stress of the Mo/Si multilayer film 45, so that wavefront aberration is generated in the optical system, thus causing a deterioration in the optical characteristics.

Accordingly, in order to reduce the compressive stress of a multilayer film with a high X-ray reflectivity, a technique has been reported in which a first multilayer film is formed on a substrate, and a multilayer film (second multilayer film) with a high X-ray reflectivity is formed on top of this first multilayer film, so that the stress of the multilayer film reflective mirror as a whole is reduced (for example, see E. Zoethout, et al., "SPIE Proceedings," 2003, Vol. 5037, p. 872, and M. Shiraishi, et al., "SPIE Proceedings," 2003, Vol. 5037, p, 249). Here, the periodic length of the first multilayer film is substantially the same as the periodic length of the second multilayer film, so that Γ is comparatively large (e.g., Γ=0.7). Since such a first multilayer film has a tensile stress, the compressive stress of the second multilayer film can be reduced.

Conventional stress reduction techniques will be described with reference to FIGS. 4 and 5.

Figure 4:
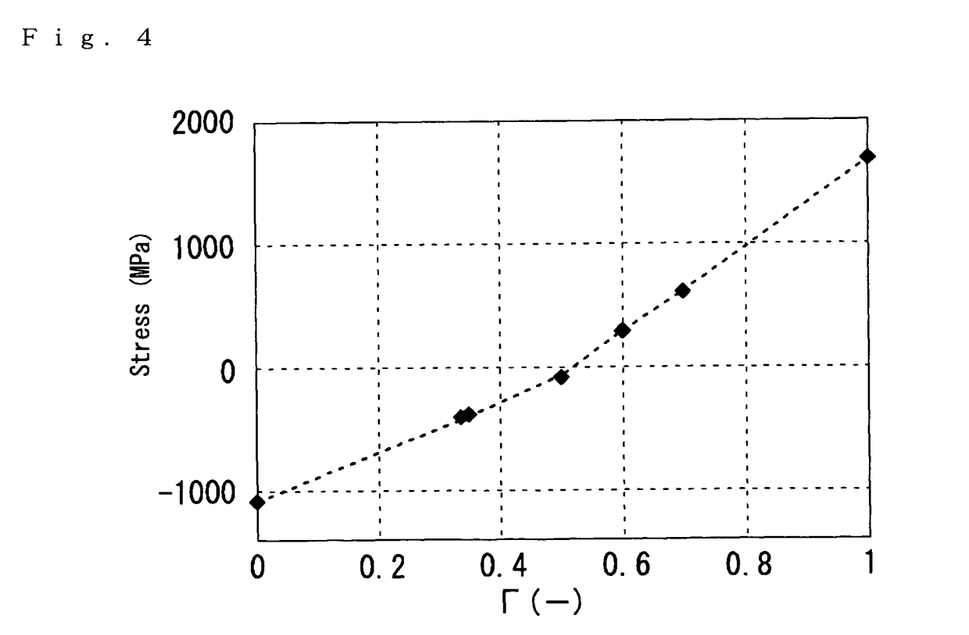
FIG. 4 is a diagram showing the stress of the multilayer film relative to Γ in a case where an Mo/Si multilayer film with a periodic length of 7.2 nm and a laminated layer number of 50 layer pairs was formed by sputtering with Γ (the ratio of the thickness of one layer to the periodic length) varied.

FIG. 4 is a diagram showing the stress in a multilayer film with respect to Γ in a case where an Mo/Si multilayer film with a periodic length of 7.2 nm and a laminated layer number of 50 layer pairs was formed by sputtering with Γ varied. In FIG. 4, the horizontal axis expresses Γ (–), which is the ratio of the thickness of one Mo layer to the periodic length. Furthermore, Γ=0 indicates an Si single-layer film with a thickness of 250 nm, and Γ=1 indicates an Mo single-layer film with a thickness of 250 nm. Moreover, in FIG. 4, the vertical axis expresses the stress (MPa) of the film, with negative values indicating a compressive stress, and positive values indicating a tensile stress. The stress of the Mo/Si multilayer film varies according to Γ; it is seen that in the range in which Γ is smaller than approximately 0.5, the stress is a compressive stress, while in the range in which Γ is larger than approximately 0.5, the stress is a tensile stress. As was described above, since Γ of the second multilayer film which has a high reflectivity is approximately 0.35 to 0.4, this film has a compressive stress of approximately –350 MPa to –450 MPa. On the other hand, by using a multilayer film having a Γ value that is greater than approximately 0.5 as the first multilayer film, it is possible to generate a tensile stress in the first multilayer film. Accordingly, the internal stress of the multilayer film as whole can be reduced by combining a second multilayer film that has a compressive stress and a first multilayer film that has a tensile stress.

Figure 5:
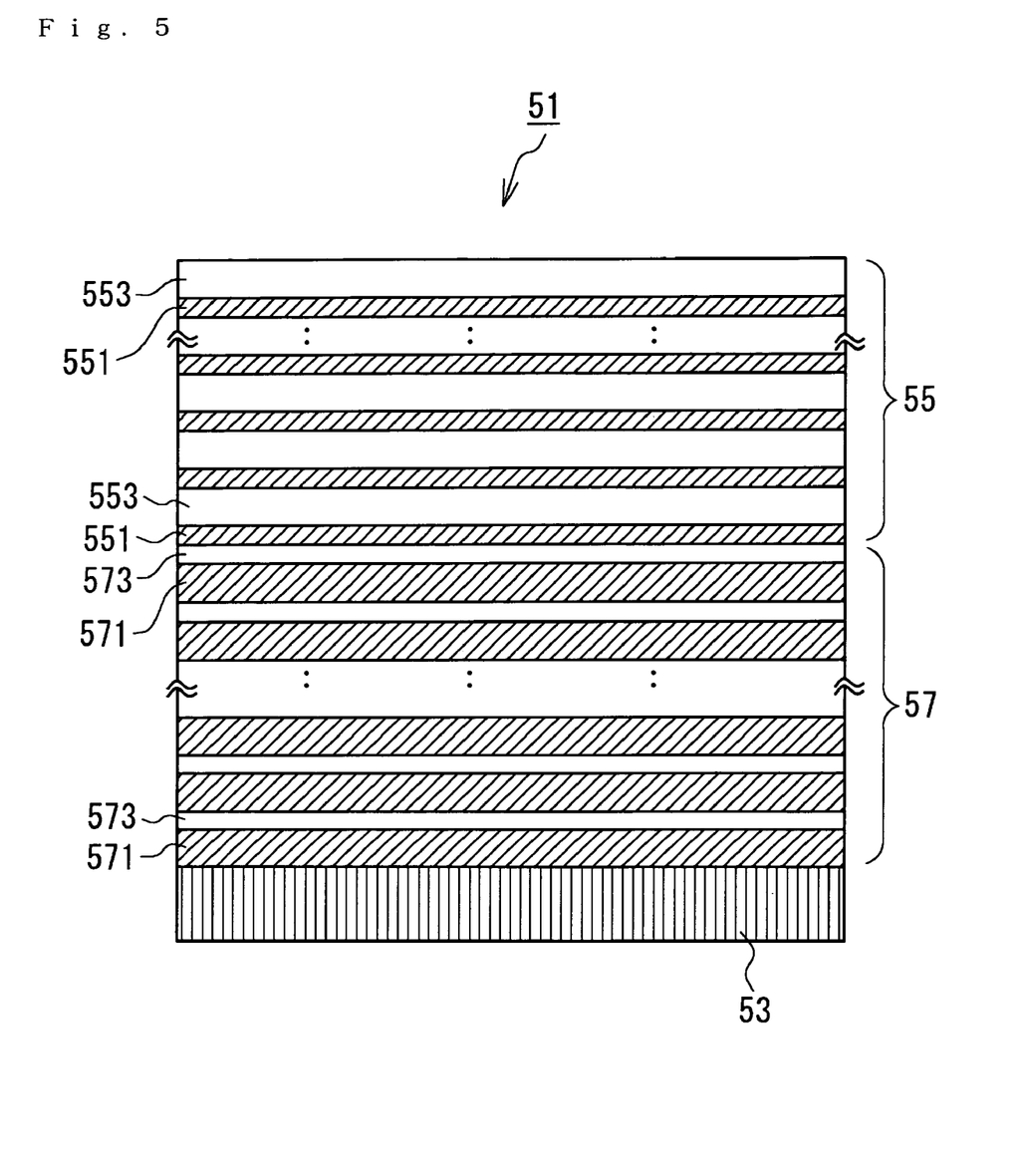
FIG. 5 is a sectional view showing the structure of a conventional low-stress multilayer film reflective mirror in model form.

FIG. 5 is a sectional view which shows the structure of a conventional low-stress multilayer film reflective mirror in model form. In this multilayer film reflective mirror 51, a first multilayer film 57 is formed between a substrate 53 and a second multilayer film 55. The second multilayer film 55 is an Mo/Si multilayer film consisting of Mo layers 551 and Si layers 553; in this film, the periodic length is set at 7.2 nm, Γ is set at 0.35, and the number of laminated layers is set at 50 layer pairs, so that a high X-ray reflectivity can be obtained. On the other hand, the first multilayer film 57 is an Mo/Si multilayer film consisting of Mo layers 571 and Si layers 573, with the periodic length set at 7.2 nm, Γ set at 0.7, and the number of laminated layer set at 30 layer pairs. Furthermore, in order to simplify the description, a portion of the multilayer film reflective mirror is made horizontal in the figure, and the number of laminated layers is abbreviated. In this multilayer film reflective mirror 51, the second multilayer film 55 has a Γ value of 0.35, and therefore has a compressive stress, while the first multilayer film 57 has a Γ value of 0.7, and therefore has a tensile stress. Accordingly, the internal stress of the multilayer film as a whole can be reduced.

However, when multilayer film reflective mirrors are actually manufactured using such a conventional stress reduction technique, the following problem is encountered: namely, although the internal stress of the multilayer films is reduced, the X-ray reflectivity drops.

DISCLOSURE OF THE INVENTION

The present invention was devised in the light of such problems; it is an object of the present invention to provide a multilayer film reflective mirror with low internal stress in which the drop in reflectivity is suppressed, and to provide an X-ray exposure apparatus or the like using this multilayer film reflective mirror.

The first invention that is used to achieve the object described above is a multilayer film reflective mirror comprising a first multilayer film which is formed by alternately laminating layers consisting of a substance (first substance) in which the difference between the refractive index of this substance in the soft X-ray region and the refractive index of a vacuum is large, and layers consisting of a substance (second substance) in which this difference is small, on a substrate, and a second multilayer film which is formed on top of the first multilayer film, and which is formed by alternately laminating layers consisting of the first substance and layers consisting of the second substance, wherein the thickness of the layers consisting of the first substance in the first multilayer film is substantially equal to or smaller than the thickness of the layers consisting of the first substance in the second multilayer film, and the ratio of the thickness of the layers consisting of the first substance to the thickness of the layers consisting of the second substance in the first multilayer film is different from the ratio of these thicknesses in the second multilayer film.

In the multilayer film reflective mirror of the present invention, the thickness of the layers of the first substance in the first multilayer film and the thickness of the layers of the first substance in the second multilayer film are made substantially equal, or the thickness of the layers of the first substance in the first multilayer film is made smaller than the thickness of the layers of the first substance in the second multilayer film. As a result, an increase in the surface roughness caused by micro-crystallization of the layers of the first substance can be suppressed, so that a drop in the reflectivity of the multilayer film reflective mirror can be suppressed. Furthermore, by making the ratio of the thickness of the layers of the first substance to the thickness of the layers of the second substance different in the first multilayer film and second multilayer film, it is possible to reduce the internal stress of the second multilayer film by means of the internal stress of the first multilayer film. Accordingly, a multilayer film reflective mirror with a low internal stress in which any drop in reflectivity is suppressed can be obtained. Moreover, the statement that "the thicknesses are substantially equal" means that cases in which these thicknesses differ somewhat are also included in the scope of the present invention, as long as the difference in thickness is in a range which is such that this difference has no effect on the reflectivity of the multilayer film reflective mirror.

In the multilayer film reflective mirror described above, it is desirable that the thickness of the layers consisting of the first substance in the first multilayer film be 50% to 120% of the thickness of the layers consisting of the first substance in the second multilayer film. As a result, the multilayer film can easily be formed, and the surface roughness can be securely kept to a permissible value or less, so that the effect on the reflectivity can be reduced.

In the present invention, it is desirable that the first multilayer film have an internal stress that counteracts the internal stress of the second multilayer film. As a result, the internal stress of the second multilayer film can be more securely reduced by means of the internal stress of the first multilayer film.

In the present invention, it is desirable that the periodic length be the total of the thickness of the layers of the first substance and the thickness of the layers of the second substance; furthermore, where Γ is the ratio of the thickness of the layers of the first substance to the periodic length, it is desirable that the Γ value of the first multilayer film be larger than the Γ value of the second multilayer film.

Generally, the multilayer film has a compressive stress when the ratio (Γ) of the thickness of the layers of the first substance to the periodic length is small, and has a tensile stress when Γ is large. The Γ value of the second multilayer film is set at a small value in order to increase the X-ray reflectivity, so that the second multilayer film has a compressive stress. Accordingly, the Γ value of the first multilayer film is set at a large value so that the first multilayer film has a tensile stress, thus making it possible to reduce the compressive stress of the second multilayer film.

In the present invention, it is desirable that the first substance be molybdenum (Mo). Furthermore, it is desirable that the second substance be silicon (Si). As a result, it is possible to obtain a multilayer film reflective mirror that is inexpensive and superior in terms of durability, and that has a high X-ray reflectivity.

The second invention that is used to achieve the object described above is a multilayer film reflective mirror comprising a first multilayer film which is formed by alternately laminating molybdenum (Mo) layers and silicon (Si) layers on a substrate, and a second multilayer film which is formed on top of this first multilayer film, and which is formed by alternately laminating Mo layers and Si layers, wherein the thickness of the Mo layers of the first multilayer film is 1.2 nm to 3 nm, and the ratio of the thickness of the Mo layers to the thickness of the Si layers in the first multilayer film differs from the ratio of the thickness of the Mo layers to the thickness of the Si layers in the second multilayer film.

In the multilayer film reflective mirror of the present invention, since an Mo/Si multilayer film is used as the multilayer film, it is possible to obtain a multilayer film reflective mirror which is inexpensive and superior in terms of durability, and which has a high X-ray reflectivity. Furthermore, since the thickness of the Mo layers in the first multilayer film is set at 1.2 nm to 3 nm, an increase in the surface roughness caused by micro-crystallization of the Mo layers can be suppressed, so that a drop in the reflectivity of the multilayer film reflective mirror can be suppressed. Moreover, since the ratio of the thickness of the Mo layers to the thickness of the Si layers is varied between the first multilayer film and second multilayer film, the internal stress of the second multilayer film can be reduced by means of the internal stress of the first multilayer film. Accordingly, a multilayer film reflective mirror with a low internal stress in which the drop in reflectivity is suppressed can be obtained.

The third invention that is used to achieve the object described above is an X-ray exposure apparatus which comprises an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the illumination optical system, mask and projection optical system has one of the multilayer film reflective mirrors described above.

In the present invention, the internal stress can be reduced while suppressing a drop in the reflectivity of the multilayer film reflective mirror; accordingly, a deterioration in the optical characteristics can be prevented, so that a high-performance X-ray exposure apparatus can be obtained.

BEST MODE FOR CARRYING OUT THE INVENTION

As a result of investigating the problems encountered in the prior art described above, the present inventor obtained the following findings:

In a multilayer film (e.g., an Mo/Si multilayer film) formed by alternately laminating layers consisting of a substance in which the difference between the refractive index of this substance in the X-ray region and the refractive index of a vacuum is large (first substance, e.g., Mo) and layers consisting of a substance in which this difference is small (second substance, e.g., Si), the Mo layers tend to undergo micro-crystallization, and, depending on the film formation method used, micro-crystallization may become more conspicuous as the thickness of the Mo layers increases, so that the surface roughness of the Mo layers increases.

For example, the surface roughness when the thickness of the Mo layers is approximately 2.5 nm (Γ=0.35) is approximately 0.25 nmRMS, the surface roughness when the thickness of the Mo layers is approximately 3.6 nm (Γ=0.5) is approximately 0.34 nmRMS, the surface roughness when the thickness of the Mo layers is approximately 4.3 nm (Γ=0.6) is approximately 0.49 nmRMS, and the surface roughness when the thickness of the Mo layers is approximately 5 nm (Γ=0.7) is approximately 0.61 nmRMS; thus, the surface roughness increases with an increase in the thickness of the Mo layers.

Furthermore, when the surface roughness of the Mo layers increases as a result of micro-crystallization, the reflectivity of the multilayer film reflective mirror drops. For example, the reflectivity when the thickness of the Mo layers is approximately 2.5 nm (Γ=0.35) is approximately 70%, the reflectivity when the thickness of the Mo layers is approximately 3.6 nm (Γ=0.5) is approximately 65%, the reflectivity when the thickness of the Mo layers is approximately 4.3 nm (Γ=0.6) is approximately 55%, and the reflectivity when the thickness of the Mo layers is approximately 5 nm (Γ=0.7) is approximately 40%; thus, the reflectivity of the multilayer film reflective mirror drops as the thickness of the Mo layers increases.

In conventional stress reduction techniques, a first multilayer film which has a tensile stress is installed in order to reduce the compressive stress of the second multilayer film which has a high reflectivity. The periodic length of this first multilayer film is substantially the same as the periodic length of the second multilayer film, and Γ is relatively large (e.g., Γ is approximately 0.7); accordingly, the thickness of the Mo layers in the first multilayer film is increased.

For instance, referring to FIG. 5, in a conventional low-stress multilayer film reflective mirror 51, the thickness of the Mo layers 551 in the second multilayer film 55 is approximately 2.5 nm (7.2 nm×0.35), while the thickness of the Mo layers 571 in the first multilayer film 57 is approximately 5 nm (7.2 nm×0.7), so that the thickness of the Mo layers 571 is increased compared to the thickness of the Mo layers 551.

Since micro-crystallization becomes conspicuous as the thickness of the Mo layers increases, the surface roughness caused by the micro-crystallization of the Mo layers 571 increases. When the surface roughness caused by the micro-crystallization of the Mo layers 571 thus increases, the reflectivity of the second multilayer film 55 that is formed on top of the first multilayer film 57 drops. As a result, the reflectivity of the multilayer film reflective mirror 51 drops.

Accordingly, in the present invention, a method was adopted in which Γ is increased without greatly increasing the thickness of the Mo layers in the first multilayer film. Specifically, in the multilayer film reflective mirror of the present invention, the thickness of the Mo layers in the first multilayer film is substantially the same as the thickness of the Mo layers in the second multilayer film having a high reflectivity, or the thickness of the Mo layers in the first multilayer film is smaller than the thickness of the Mo layers in the second multilayer film. Furthermore, the thickness of the Si layers in the first multilayer film is smaller than the thickness of the Si layers in the second multilayer film.

Working configurations of the present invention will be described below with reference to the figures.

Figure 1:
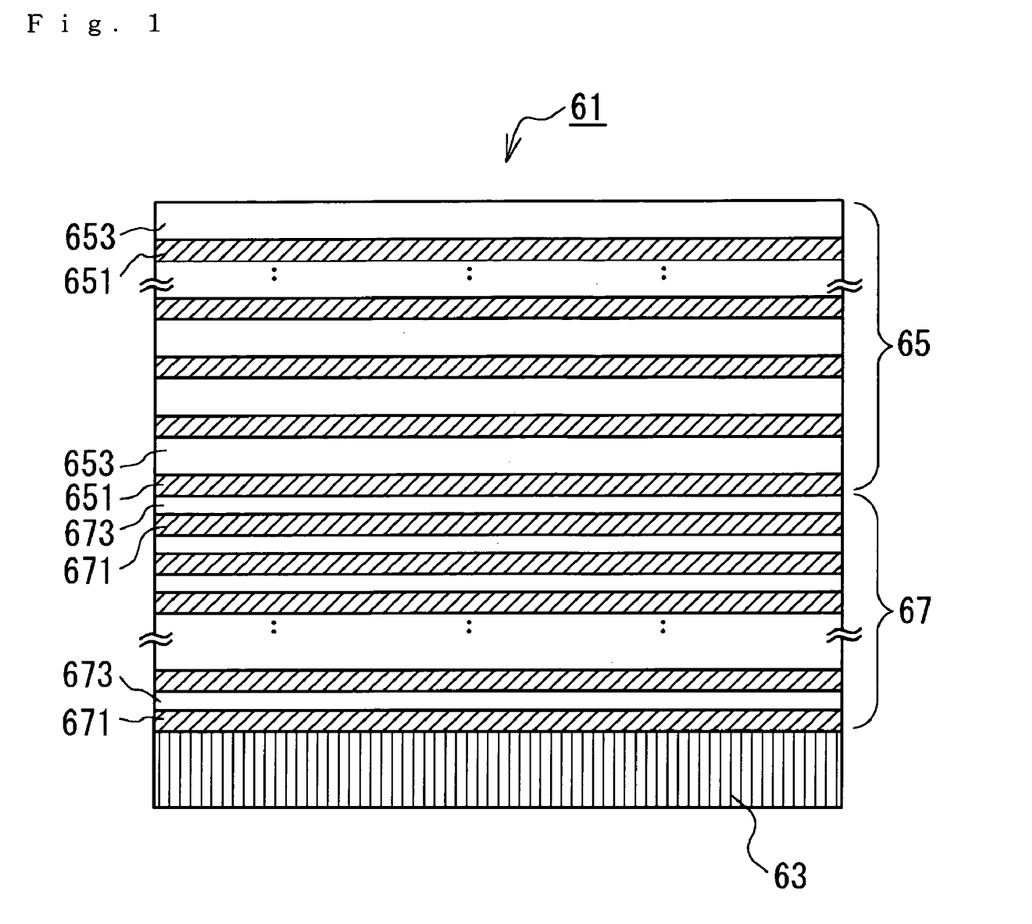
FIG. 1 is a sectional view which shows the structure of a multilayer film reflective mirror constituting a working configuration of the present invention in model form.

FIG. 1 is a sectional view which shows the structure of a multilayer film reflective mirror constituting a working configuration of the present invention in model form. In this multilayer film reflective mirror 61, a first multilayer film 67 is formed between a substrate 63 and a second multilayer film 65. The second multilayer film 65 is an Mo/Si multilayer film consisting of Mo layers 651 and Si layers 653; this multilayer film 65 has a periodic length of 7.2 nm, a Γ value of 0.35, and a laminated layer number of 50 layer pairs, thus making it possible to obtain a high X-ray reflectivity.

Meanwhile, the first multilayer film 67 is an Mo/Si multilayer film consisting of Mo layers 671 and Si layers 673; this multilayer film 67 has a periodic length of 3.6 nm, a Γ value of 0.7 and a laminated layer number of 88 layer pairs. Furthermore, in order to simplify the description, in the figure, a portion of the multilayer film reflective mirror is made horizontal, and the number of laminated layers is abbreviated.

In this multilayer film reflective mirror 61, the thickness of the Mo layers 651 in the second multilayer film 65 is approximately 2.5 nm (7.2 nm×0.35). Furthermore, the thickness of the Mo layers 671 in the first multilayer film 67 is approximately 2.5 nm (3.6 nm×0.7), so that this thickness is set equal to the thickness of the Mo layers 651 in the second multilayer film 65. Moreover, these thicknesses may also differ somewhat as long as this difference is in a range which is such that there is no effect on the reflectivity of the multilayer film reflective mirror. Furthermore, the thickness of the layers of the first substance (Mo layers) in the first multilayer film may also be made smaller than the thickness of the layers of the first substance (Mo layers) in the second multilayer film.

The thickness of the layers of the first substance in the first multilayer film must be adjusted in accordance with the stress that is required in order to reduce the stress in the second multilayer film, the work that is required for multilayer film formation, and the like. If the thickness of the layers of the first substance in the first multilayer film is less than 50% of the thickness of the layers of the first substance in the second multilayer film, the formation of the multilayer film may become difficult, and it may become impossible to obtain the stress that is required in order to reduce the stress in the second multilayer film. Furthermore, the work required for forming the multilayer film is increased, e.g., the number of laminated layers in the multilayer film is greatly increased in order to obtain the necessary stress.

On the other hand, if the thickness of the layers of the first substance in the first multilayer film exceeds 120% of the thickness of the layers of the first substance in the second multilayer film, the surface roughness caused by micro-crystallization exceeds the permissible value (approximately 0.3 nmRMS), so that there is an effect on the reflectivity of the multilayer film reflective mirror.

Accordingly, it is desirable that the thickness of the layers of the first substance in the first multilayer film be 50% to 120% of the thickness of the layers of the first substance in the second multilayer film. Furthermore, if the thickness of the layers of the first substance in the first multilayer film is set at 75% to 115% of the thickness of the layers of the first substance in the second multilayer film, the multilayer film can be formed more easily, and the surface roughness can be more securely kept to the permissible value or less, so that the effect on the reflectivity can be reduced; accordingly, such a thickness is even more desirable.

Here, the EUV reflectivity of the multilayer film reflective mirror 61 will be discussed. The reflectivity of an Mo/Si multilayer film increases with the number of laminated layers; when a certain fixed number of layers is exceeded, this reflectivity reaches saturation and becomes fixed. The number of laminated layers in the second multilayer film 65 is approximately 40 layer pairs to 50 layer pairs, which is a sufficient number of layers for the reflectivity to become saturated. Accordingly, even if the periodic length of the first multilayer film 67 located beneath the second multilayer film 65 is not set so that this film has a high reflectivity with respect to the EUV wavelength used, the EUV reflectivity of the multilayer film reflective mirror 61 is maintained "as is" at a high value.

Furthermore, the thickness of the Mo layers 671 in the first multilayer film 67 is set equal to the thickness of the Mo layers 651 in the second multilayer film 65. Accordingly, there is no drop in reflectivity caused by an increase in the thickness of the Mo layers. Thus, in the multilayer film reflective mirror 61 of the present invention, such a drop in the EUV reflectivity is suppressed, so that the mirror has a high reflectivity.

Next, the internal stress of the multilayer film reflective mirror 61 will be discussed. Even in the case of a multilayer film in which Γ is increased and the periodic length is shortened (e.g., to 3.6 nm) without varying the thickness of the Mo layers, as in the first multilayer film 67, it has been confirmed that multilayer films with a large Γ value have a tensile stress. Accordingly, by combining the second multilayer film 65 which has a compressive stress and the first multilayer film 67 which has a tensile stress, it is possible to reduce the internal stress of the multilayer film reflective mirror 61. In this case, the force that is applied to the substrate increases with an increase in the film thickness even at the same stress; therefore, it is advisable to consider not only the magnitude of the stress in the respective multilayer films, but also the "total stress" which is the product of the film thicknesses of the individual multilayer films and the magnitude of the stress. After the stress values for the individual multilayer films are measured, the number of laminated layers of the first multilayer film 67 may be appropriately selected so that the total stress of the second multilayer film 65 and the total stress of the first multilayer film 67 are balanced.

For example, where d2 is the periodic length of the second multilayer film 65, N2 is the number of laminated layers, and S2 is the stress, the total stress T2 of the second multilayer film 65 is expressed as follows:

$$T2 = d2 \times N2 \times S2$$

Similarly, where d1 is the periodic length of the first multilayer film 67, N1 is the number of laminated layers, and S1 is the stress, the total stress T1 of the first multilayer film 67 is expressed as follows:

$$T1 = d1 \times N1 \times S1$$

Accordingly, by selecting the number of laminate layers N1 of the first multilayer film 67 so that T1+T2=0, it is possible to cancel the internal stress of the multilayer film reflective mirror 61. However, there are cases in which the stress also varies in accordance with the number of laminated layers, and cases in which the stress is not completely canceled by the number of laminated layers selected as described above. In such cases, it is necessary to adjust the number of laminated layers of the first multilayer film 67 in accordance with the residual stress. Furthermore, as was described above, since the thickness of the Mo layers 671 of the first multilayer film 67 is not varied, there is no drop in reflectivity caused by an increase in the thickness of the Mo layers.

Thus, a multilayer film reflective mirror with a low internal stress in which the drop in reflectivity is suppressed can be obtained by combining a second multilayer film 65 and a first multilayer film 67 in which the thickness of the Mo layers is substantially the same, but the Γ value is different.

Embodiment 1

In Embodiment 1 of the present invention, a second multilayer film 65 and a first multilayer film 67 were formed using a low-voltage discharge cathode type rotary magnet cathode sputtering apparatus (a type of direct-current magnetron sputtering apparatus). The film formation conditions were as follows: namely, xenon (Xe) was used as the sputtering gas, the Xe gas flow was set at 3 sccm (0.08 Pa), and the cathode power was set at 200 W in the case of Mo, and 400 W in the case of Si. The second multilayer film 65 was an Mo/Si multilayer film in which the periodic length d2 was set at 7.2 nm, Γ was set at 0.35, and the number of laminated layers N2 was set at 50 layer pairs in order to obtain a high X-ray reflectivity. When the EUV reflectivity of this second multilayer film 65 was measured, a value of approximately 69% was obtained. Furthermore, the stress S2 of the second multilayer film 65 was a compressive stress of −350 MPa.

In order to reduce the compressive stress of the second multilayer film 65, an Mo/Si multilayer film with a periodic length d1 of 3.6 nm and a Γ value of 0.7 was selected as the first multilayer film 67 having a tensile stress. The thickness of the Mo layers 671 in this first multilayer film 67 was the same as the thickness of the Mo layers 651 in the second multilayer film 65. When the stress S1 of the first multilayer film 67 was measured, a tensile stress value of +400 MPa was obtained.

Here, the method used to determine the number of laminated layers N1 in the first multilayer film 67 will be described. The number of laminated layers N1 in the first multilayer film 67 was determined as shown below on the basis of the stress values of the second multilayer film 65 and first multilayer film 67.

The total stress T2 of the second multilayer film 65 in which the number of laminated layers is 50 layer pairs is as follows:

$$\begin{aligned} T2 &= d2 \times N2 \times S2 \\ &= (7.2 \text{ nm}) \times (50) \times (-350 \text{ MPa}) \\ &= -126 \text{ N/m} \end{aligned}$$

From the conditional formula T1+T2=0 used to reduce the internal stress of the multilayer film reflective mirror 61 and the formula T1=d1×N1×S1 for determining the total stress T1 of the first multilayer film 67, the number of laminated layers N1 of the first multilayer film 67 is as follows:

$$\begin{aligned} N1 &= (+126 \text{ N/m}) / \{(3.6 \text{ nm}) \times (+400 \text{ MPa})\} \\ &= 87.5 \\ &\approx 88 \end{aligned}$$

Furthermore, since the number of laminated layers N1 must be set as an integer, decimal fractions are rounded upward, so that N1=88 layer pairs.

Accordingly, as is shown in FIG. 1, a first multilayer film 67 in which the number of laminated layers was 88 layer pairs was formed on the substrate 63, and a second multilayer film 65 in which the number of laminated layers was 50 layer pairs was formed on top of this first multilayer film 67. When the stress of this multilayer film reflective mirror 61 was measured, it was found that this stress had been reduced to 20 MPa or less.

Furthermore, the stress of the multilayer film reflective mirror 61 can be reduced to a value close to zero by a further fine adjustment of the number of laminated layers N1 of the first multilayer film 67. Moreover, the surface roughness of the multilayer film reflective mirror 61 was approximately 0.26 nmRMS, and was thus kept below the permissible value (approximately 0.3 nmRMS). Furthermore, the reflectivity of the multilayer film reflective mirror 61 was 69%, so that almost no drop in reflectivity was recognized.

COMPARATIVE EXAMPLE

For purposes of comparison, the internal stress and reflectivity in a case where a multilayer film reflective mirror was manufactured using a conventional stress reduction technique were also determined. This conventional multilayer film reflective mirror was, for example, the multilayer film reflective mirror 51 shown in FIG. 5.

The second multilayer film 55 of the multilayer film reflective mirror 51 was similar to the second multilayer film 65 of the multilayer film reflective mirror 61 of the present invention. Accordingly, the total stress T4 of the second multilayer film 55 in which the number of laminated layers was 50 layer pairs was as follows:

$$T4 = (7.2 \text{ nm}) \times (50) \times (-350 \text{ MPa})$$
$$= -126 \text{ N/m}$$

Assuming that the periodic length d3 of the first multilayer film 57 was 7.2 nm, and that the stress S3 was a tensile stress of +600 MPa, the number of laminated layer N3 in the first multilayer film 57 required in order to reduce the internal stress of the multilayer film reflective mirror 51 was as follows:

$$N3 = (+126 \text{ N/m}) / \{(7.2 \text{ nm}) \times (+600 \text{ MPa})\}$$
$$\approx 30$$

Accordingly, as is shown in FIG. 5, a first multilayer film 57 in which the number of laminated layers was 30 layer pairs was formed on the substrate 53, and a second multilayer film 55 in which the number of laminated layers was 50 layer pairs was formed on top of this first multilayer film 57. When the stress of this multilayer film reflective mirror 51 was measured, it was found that the stress had been reduced to 20 MPa or less. However, the reflectivity of the multilayer film reflective mirror 51 dropped to 63%. It appears that the reason for this was that since the thickness of the Mo layers 571 in the first multilayer film 57 of the multilayer film reflective mirror 51 was large, i.e., approximately 5 nm (7.2 nm×0.7), the surface roughness increased as a result of micro-crystallization of the Mo layers. Accordingly, when the surface roughness of the multilayer film reflective mirror 51 was measured, the value obtained was approximately 0.39 nmRMS, which exceeded the permissible value (approximately 0.3 nmRMS) for the surface roughness.

Thus, it was found that the multilayer film reflective mirror 51 in FIG. 5 using a conventional stress reduction technique showed a drop in reflectivity, while the multilayer film reflective mirror 61 of the present invention shown in FIG. 1 allowed a reduction in stress to be achieved while maintaining a high reflectivity.

Embodiment 2

In Embodiment 2 of the present invention, a second multilayer film 65 and a first multilayer film 67 were formed using a low-voltage discharge cathode type rotary magnet cathode sputtering apparatus (a type of direct-current magnetron sputtering apparatus). The film formation conditions were as follows: namely, xenon (Xe) was used as the sputtering gas, the Xe gas flow was set at 3 sccm (0.08 Pa), and the cathode power was set at 200 W in the case of Mo, and 400 W in the case of Si. The second multilayer film 65 was an Mo/Si multilayer film in which the periodic length d2 was set at 7.2 nm, Γ was set at 0.35, and the number of laminated layers N2 was set at 50 layer pairs in order to obtain a high X-ray reflectivity. When the EUV reflectivity of this second multilayer film 65 was measured, a value of approximately 69% was obtained. Furthermore, the stress S2 of the second multilayer film 65 was a compressive stress of −350 MPa.

In order to reduce the compressive stress of the second multilayer film 65, an Mo/Si multilayer film with a periodic length d1 of 2.9 nm and a Γ value of 0.75 was selected as the first multilayer film 67 having a tensile stress. The thickness of the Mo layers 671 in this first multilayer film 67 was smaller than the thickness of the Mo layers 651 in the second multilayer film 65. When the stress S1 of the first multilayer film 67 was measured, a tensile stress value of +300 MPa was obtained.

Here, the method used to determine the number of laminated layers N1 in the first multilayer film 67 will be described. The number of laminated layers N1 in the first multilayer film 67 was determined as follows on the basis of the stress values of the second multilayer film 65 and first multilayer film 67.

The total stress T2 of the second multilayer film 65 in which the number of laminated layers is 50 layer pairs is as follows:

$$T2 = d2 \times N2 \times S2$$
$$= (7.2 \text{ nm}) \times (50) \times (-350 \text{ MPa})$$
$$= -126 \text{ N/m}$$

From the conditional formula T1+T2=0 used to reduce the internal stress of the multilayer film reflective mirror 61 and the formula T1=d1×N1×S1 for determining the total stress T1 of the first multilayer film 67, the number of laminated layers N1 of the first multilayer film 67 is as follows:

$$N1 = (+126 \text{ N/m}) / \{(2.9 \text{ nm}) \times (+300 \text{ MPa})\}$$
$$\approx 145$$

Accordingly, as is shown in FIG. 1, a first multilayer film 67 in which the number of laminated layers was 145 layer pairs was formed on the substrate 63, and a second multilayer film 65 in which the number of laminated layers was 50 layer pairs was formed on top of this first multilayer film 67. When the stress of this multilayer film reflective mirror 61 was measured, it was found that this stress had been reduced to 20 MPa or less. Furthermore, the stress of the multilayer film reflective mirror 61 can be reduced to a value close to zero by a further fine adjustment of the number of laminated layers N1 of the first multilayer film 67. Moreover, the surface roughness of the multilayer film reflective mirror 61 was approximately 0.26 nmRMS, and was thus kept below the permissible value (approximately 0.3 nmRMS). Furthermore, the reflectivity of the multilayer film reflective mirror 61 was 69%, so that almost no drop in reflectivity was recognized.

Embodiment 3

In Embodiment 3 of the present invention, a second multilayer film 65 and a first multilayer film 67 were formed using a low-voltage discharge cathode type rotary magnet cathode sputtering apparatus (a type of direct-current magnetron sputtering apparatus). The film formation conditions were as follows: namely, xenon (Xe) was used as the sputtering gas, the Xe gas flow was set at 3 sccm (0.08 Pa), and the cathode power was set at 200 W in the case of Mo, and 400 W in the case of Si. The second multilayer film 65 was an Mo/Si multilayer film in which the periodic length d2 was set at 7.2 nm, Γ was set at 0.35, and the number of laminated layers N2 was set at 50 layer pairs in order to obtain a high X-ray reflectivity When the EUV reflectivity of this second multilayer film 65 was measured, a value of approximately 69% was obtained. Furthermore, the stress S2 of the second multilayer film 65 was a compressive stress of −350 MPa.

In order to reduce the compressive stress of the second multilayer film 65, an Mo/Si multilayer film with a periodic length d1 of 4.6 nm and a Γ value of 0.65 was selected as the first multilayer film 67 having a tensile stress. When the stress S1 of the first multilayer film 67 was measured, a tensile stress value of +300 MPa was obtained.

Here, the method used to determine the number of laminated layers N1 in the first multilayer film 67 will be described. The number of laminated layers N1 in the first multilayer film 67 was determined as follows on the basis of the stress values of the second multilayer film 65 and first multilayer film 67.

The total stress T2 of the second multilayer film 65 in which the number of laminated layers is 50 layer pairs is as follows:

$$T2 = d2 \times N2 \times S2$$
$$= (7.2 \text{ nm}) \times (50) \times (-350 \text{ MPa})$$
$$= -126 \text{ N/m}$$

From the conditional formula T1+T2=0 used to reduce the internal stress of the multilayer film reflective mirror 61 and the formula T1=d1×N1×S1 for determining the total stress T1 of the first multilayer film 67, the number of laminated layers N1 of the first multilayer film 67 is as follows:

$$N1 = (+126 \text{ N/m}) / \{(4.6 \text{ nm}) \times (+300 \text{ MPa})\}$$
$$\approx 92$$

Accordingly, as is shown in FIG. 1, a first multilayer film 67 in which the number of laminated layers was 92 layer pairs was formed on the substrate 63, and a second multilayer film 65 in which the number of laminated layers was 50 layer pairs was formed on top of this first multilayer film 67. When the stress of this multilayer film reflective mirror 61 was measured, it was found that this stress had been reduced to 20 MPa or less. Furthermore, the stress of the multilayer film reflective mirror 61 can be reduced to a value close to zero by a further fine adjustment of the number of laminated layers N1 of the first multilayer film 67. Moreover, the surface roughness of the multilayer film reflective mirror 61 was approximately 0.29 nmRMS, and was thus kept below the permissible value (approximately 0.3 nmRMS). Furthermore, the reflectivity of the multilayer film reflective mirror 61 was 69%, so that almost no drop in reflectivity was recognized.

Embodiment 4

In Embodiment 4 of the present invention, a second multilayer film 65 and a first multilayer film 67 were formed using a low-voltage discharge cathode type rotary magnet cathode sputtering apparatus (a type of direct-current magnetron sputtering apparatus). The film formation conditions were as follows: namely, xenon (Xe) was used as the sputtering gas, the Xe gas flow was set at 3 sccm (0.08 Pa), and the cathode power was set at 200 W in the case of Mo, and 400 W in the case of Si. The second multilayer film 65 was an Mo/Si multilayer film in which the periodic length d2 was set at 7.2 nm, Γ was set at 0.35, and the number of laminated layers N2 was set at 45 layer pairs in order to obtain a high X-ray reflectivity. When the EUV reflectivity of this second multilayer film 65 was measured, a value of approximately 69% was obtained. Furthermore, the stress S2 of the second multilayer film 65 was a compressive stress of −350 MPa.

In order to reduce the compressive stress of the second multilayer film 65, an Mo/Si multilayer film with a periodic length d1 of 3.3 nm and a Γ value of 0.7 was selected as the first multilayer film 67 having a tensile stress. The thickness of the Mo layers 671 in this first multilayer film 67 is substantially the same as the thickness of the Mo layers 651 in the second multilayer film 65. When the stress S1 of the first multilayer film 67 was measured, a tensile stress value of +408 MPa was obtained.

Here, the method used to determine the number of laminated layers N1 in the first multilayer film 67 will be described. The number of laminated layers N1 in the first multilayer film 67 was determined as follows on the basis of the stress values of the second multilayer film 65 and first multilayer film 67.

The total stress T2 of the second multilayer film 65 in which the number of laminated layers is 45 layer pairs is as follows:

$$T2 = d2 \times N2 \times S2$$
$$= (7.2 \text{ nm}) \times (45) \times (-350 \text{ MPa})$$
$$= -113 \text{ N/m}$$

From the conditional formula T1+T2=0 used to reduce the internal stress of the multilayer film reflective mirror 61 and the formula T1=d1×N1×S1 for determining the total stress T1 of the first multilayer film 67, the number of laminated layers N1 of the first multilayer film 67 is as follows:

$$N1 = (+113 \text{ N/m}) / \{(3.3 \text{ nm}) \times (+408 \text{ MPa})\}$$
$$\approx 84$$

Accordingly, as is shown in FIG. 1, a first multilayer film 67 in which the number of laminated layers was 84 layer pairs was formed on the substrate 63, and a second multilayer film 65 in which the number of laminated layers was 45 layer pairs was formed on top of this first multilayer film 67. When the stress of this multilayer film reflective mirror 61 was measured, it was found that this stress had been reduced to 20 MPa or less. Furthermore, the stress of the multilayer film reflective mirror 61 can be reduced to a value close to zero by a further fine adjustment of the number of laminated layers N1 of the first multilayer film 67. For example, when the number of laminated layers N1 of the first multilayer film 67 was set at 130 layer pairs, the stress of the multilayer film reflective mirror 61 was successfully reduced to −6 MPa. Moreover, the surface roughness of the multilayer film reflective mirror 61 was approximately 0.26 nmRMS, and was thus kept below the permissible value (approximately 0.3 nmRMS). Furthermore, the reflectivity of the multilayer film reflective mirror 61 was 69%, so that almost no drop in reflectivity was recognized.

Embodiment 5

Figure 2:
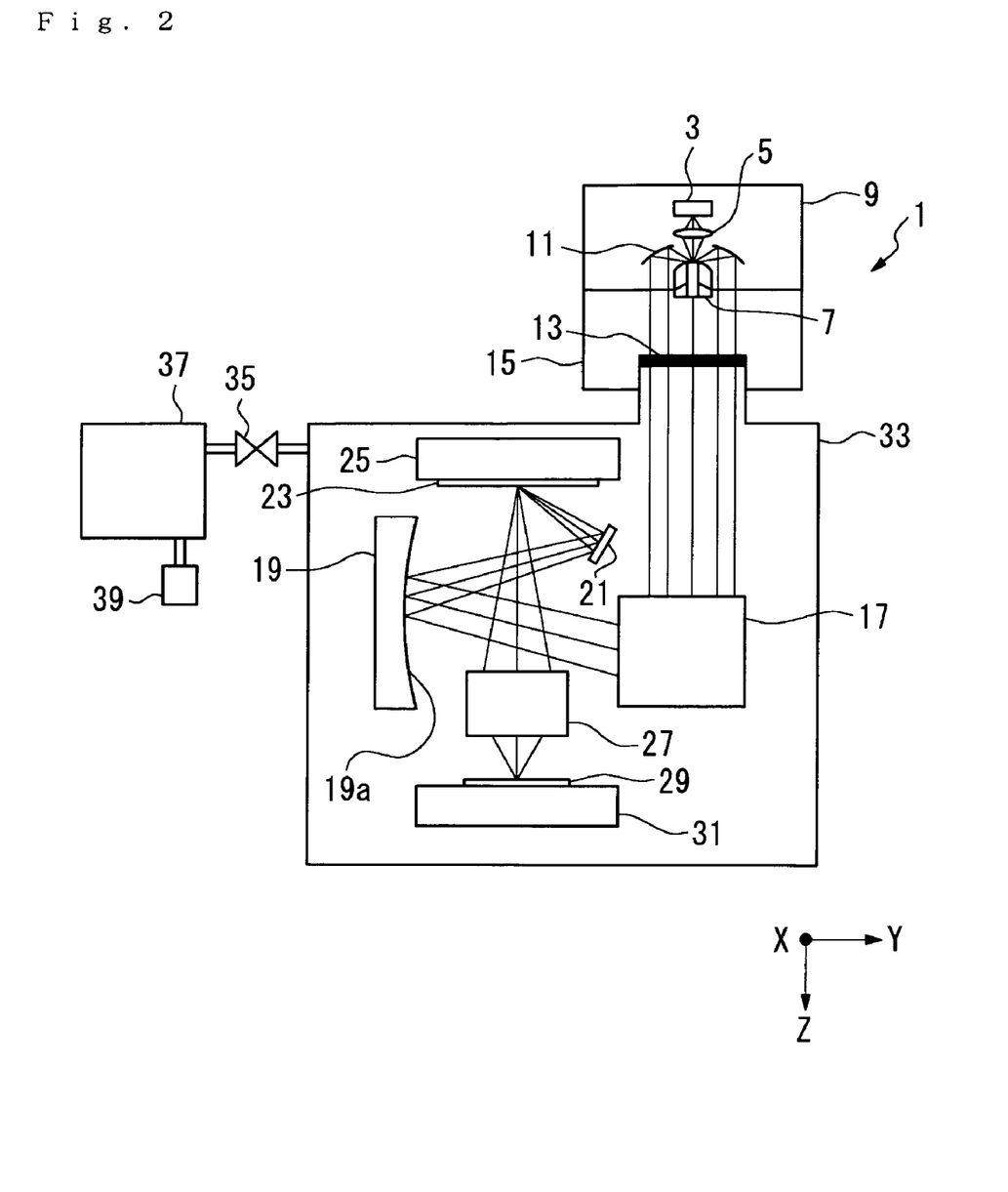
FIG. 2 is a diagram showing the overall construction of an X-ray exposure apparatus mounting the multilayer film reflective mirror shown in FIG. 1.

Next, an outline of an X-ray exposure apparatus mounting the multilayer film reflective mirror shown in FIG. 1 will be described with reference to FIG. 2. FIG. 2 is a diagram showing the overall construction of the X-ray exposure apparatus of the present invention.

This X-ray exposure apparatus is a projection exposure apparatus that performs an exposure operation by means of a step and scan system using light in the soft X-ray region in the vicinity of a wavelength of 13 nm (hereafter referred to as EUV light) as illuminating light used for exposure.

A laser light source 3 is disposed in the furthest upstream part of the X-ray exposure apparatus 1. The laser light source 3 has the function of supplying laser light with a wavelength in the infrared region to visible region; for example, a YAG laser, excimer laser, or the like using semiconductor laser excitation is used. The laser light emitted from the laser light source 3 is focused by a focusing optical system 5, and reaches a laser plasma light source 7 disposed in the lower part. The laser plasma light source 7 can generate X-rays in the vicinity of a wavelength of 13 nm with good efficiency.

A nozzle (not shown in the figure) is disposed in the laser plasma light source 7; this nozzle jets xenon gas. The jetting xenon gas is subjected to high-intensity laser light in the laser plasma light source 7. The xenon gas is elevated to a high temperature by the energy of the high-intensity laser light, and is excited to a plasma state; then, when the gas makes a transition to a low potential state, the gas emits EUV light. Since EUV light has a low transmissivity with respect to air, the light path is covered by a chamber (vacuum chamber) 9 so that the outside air is blocked. Furthermore, since debris is generated from the nozzle that emits the xenon gas, it is necessary to dispose the chamber 9 separately from other chambers.

A rotary parabolic reflective mirror 11 coated with an Mo/Si multilayer film is disposed in the upper part of the laser plasma light source 7. The X-rays radiated from the laser plasma light source 7 are incident on the parabolic reflective mirror 11, and only X-rays in the vicinity of a wavelength of 13 nm are reflected in parallel toward the bottom of the exposure apparatus 1.

A visible light cutting X-ray transmitting filter 13 consisting of beryllium (Be) with a thickness of 0.15 μm is disposed beneath the rotary parabolic reflective mirror 11. Of the X-rays that are reflected by the parabolic reflective mirror 11, only the desired X-rays at a wavelength of 13 nm pass through the transmitting filter 13. The area in the vicinity of the transmitting filter 13 is covered by a chamber 15, so that the outside air is blocked.

An exposure chamber 33 is disposed beneath the transmitting filter 13. An illumination optical system 17 is disposed beneath the transmitting filter 13 inside the exposure chamber 33. The illumination optical system 17 is constructed from the reflective mirrors of a condenser system, the reflective mirrors of a fly-eye optical system, or the like; this optical system 17 shapes the X-rays that are input from the transmitting filter 13 into a circular arc shape, and provides illumination that is oriented toward the left side of the figure.

An X-ray reflective mirror 19 is disposed on the left side of the illumination optical system 17 in the figure. This X-ray reflective mirror 19 is a circular rotary parabolic mirror in which the reflective surface 19a on the right side (with respect to the figure) has a concave shape; this mirror is held in a vertical position by a holding member. The X-ray reflective mirror 19 consists of a quartz substrate in which a reflective surface 19a is worked with a high degree of precision. A multilayer film of Mo and Si which has a high reflectivity for X-rays at a wavelength of 13 nm is formed on the reflective surface 19a. Furthermore, in cases where X-rays at a wavelength of 10 to 15 nm are used, a multilayer film combining a substance such as ruthenium (Ru) or rhodium (Rh), and a substance such as Si, Be or carbon tetraboride (B4C), may also be used.

A light path bending reflective mirror 21 is disposed at an inclination to the right of the X-ray reflective mirror 19 (with respect to the figure). A reflective type mask 23 is horizontally disposed above the light path bending reflective mirror 21 so that the reflective surface of this mask 23 is at the bottom. The X-rays emitted from the illumination optical system 17 are reflected and focused by the X-ray reflective mirror 19, and then reach the reflective surface of the reflective type mask 23 via the light path bending reflective mirror 21.

A reflective film consisting of a multilayer film is also formed on the reflective surface of the reflective type mask 23. A mask pattern corresponding to the pattern that is transferred to the wafer 29 is formed in this reflective film. The reflective type mask 23 is fastened to a mask stage 25 shown above the mask 23 in the figure. The mask stage 25 can move at least in the Y direction, so that X-rays reflected by the light path bending reflective mirror 21 successively illuminate the mask 23.

A projection optical system 27 and the wafer 29 are successively disposed in the lower part of the reflective type mask 23. The projection optical system 27 consists of a plurality of reflective mirrors or the like; this optical system 27 reduces the pattern on the reflective type mask 23 to a specified reduction magnification (e.g., ¼), and focuses this pattern on the wafer 29. The wafer 29 is fastened by suction chucking or the like to a wafer stage 31 that can move in the X, Y and Z directions.

A preliminary evacuation chamber 37 (load and lock chamber) is disposed to the exposure chamber 33 via a gate valve 35. A vacuum pump 39 is connected to the preliminary evacuation chamber 37, and the preliminary evacuation chamber 37 is evacuated to a vacuum by the operation of the vacuum pump 39.

When an exposure operation is performed, the reflective surface of the reflective type mask 23 is illuminated with EUV light by the illumination optical system 17. In this case, the reflective projection optical system 27 is caused to perform a relative synchronized scan of the reflective type mask 23 and wafer 29 at a specified speed ratio determined by the reduction magnification of the projection optical system. As a result, the entire circuit pattern of the reflective type mask 23 is transferred by a step and scan system to each of a plurality of shot regions on the wafer 29. Furthermore, the chips of the wafer 29 are, for example, 25×25 mm square, and an IC pattern of 0.07 μm L/S can be exposed on the resist.

By using the multilayer film reflective mirror 61 shown in FIG. 1 as the reflective mirrors in the X-ray exposure apparatus 1, it is possible to provide an X-ray exposure apparatus which has a high reflectivity without causing any deterioration in the optical performance, and to suppress a drop in the throughput.

The invention claimed is:

1. A multilayer film reflective mirror comprising a first multilayer film which is formed by alternately laminating layers comprising a first substance having a thickness and layers comprising a second substance, having a thickness, on a substrate, and a second multilayer film which is formed on the first multilayer film, and which is formed by alternately laminating layers comprising the first substance having a thickness and layers comprising the second substance having a thickness,
   wherein a difference between the refractive index of the first substance in the soft X-ray region and the refractive index first multilayer film is 50% to 120% of the thickness of the layer comprising the first substance in the second multilayer film.

2. The multilayer film reflective mirror according to claim 1, wherein the thickness of the layer comprising the first substance in the.

3. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 2.

4. The multilayer film reflective mirror according to claim 1, wherein the first multilayer film has an internal stress that counteracts the internal stress of the second multilayer film.

5. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 3.

6. The multilayer film reflective mirror according to claim 1, wherein the $\Gamma$ value of the first multilayer film is greater than the $\Gamma$ value of the second multilayer film.

7. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 6.

8. The multilayer film reflective mirror according to claim 1, wherein the first substance is molybdenum of a vacuum is larger than a difference between the refractive index of the second substance in the soft X-ray region and the refractive index of a vacuum,
   the thickness of the layer comprising the first substance in the first multilayer film is substantially equal to or smaller than the thickness of the layer comprising the first substance in the second multilayer film, and a $\Gamma$ value of the first multilayer film differs from a $\Gamma$ value of the second multilayer film, and is larger than 0.5,
   wherein the $\Gamma$ value is a ratio of the thickness of the layer of the first substance to a periodic length, and the periodic length is the sum of the thickness of the layer of the first substance and the thickness of the layer of the second substance.

9. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 8.

10. The multilayer film reflective mirror according to claim 1, wherein the second substance is silicon.

11. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 10.

12. A multilayer film reflective mirror comprising a first multilayer film which is formed by alternately laminating molybdenum layers having a thickness and silicon layers having a thickness, on a substrate, and a second multilayer film which is formed on the first multilayer film, and which is formed by alternately laminating molybdenum layers having a thickness and silicon layers having a thickness, wherein the thickness of the molybdenum layer in the first multilayer film is 1.2 nm to 3 nm, and a $\Gamma$ value of the first multilayer film differs from a $\Gamma$ value of the second multilayer film, and is larger than 0.5,
   wherein the $\Gamma$ value is a ratio of the thickness of the molybdenum layer to a periodic length, and the periodic length is the sum of the thickness of the molybdenum layer and the thickness of the silicon layer.

13. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 1.

14. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 12.

15. A multilayer film reflective mirror comprising a first multilayer film which is formed by alternately laminating layers comprising a first substance having a thickness and layers comprising a second substance having a thickness, on a substrate, and a second multilayer film which is formed on the first multilayer film, and which is formed by alternately laminating layers comprising the first substance having a thickness and layers comprising the second substance having a thickness, wherein a difference between the refractive index of the first substance in the soft X-ray region and the refractive index of a vacuum is larger than a difference between the refractive index of the second substance in the soft X-ray region and the refractive index of a vacuum, the thickness of the layer comprising the first substance in the first multilayer film is substantially equal to or smaller than the thickness of the layer comprising the first substance in the second multilayer film, and the first multilayer film has tensile stress and the second multilayer film has compressive stress.

16. An X-ray exposure apparatus comprising an X-ray light source that generates X-rays, an illumination optical system that conducts X-rays from this X-ray light source to a mask, and a projection optical system that conducts the X-rays from the mask to a photosensitive substrate, and which transfers the pattern of the mask to the photosensitive substrate, wherein at least one part selected from the group consisting of the illumination optical system, the mask and the projection optical system comprises the multilayer film reflective mirror according to claim 15.

* * * * *